United States Patent [19]
Fant et al.

[11] Patent Number: 5,764,081
[45] Date of Patent: Jun. 9, 1998

[54] NULL CONVENTION INTERFACE CIRCUITS

[75] Inventors: Karl M. Fant, Minneapolis; Larry L. Kinney, Fridly, both of Minn.

[73] Assignee: Theseus Logic, Inc., St. Paul, Minn.

[21] Appl. No.: 788,914

[22] Filed: Jan. 22, 1997

Related U.S. Application Data

[63] Continuation of Ser. No. 423,770, Apr. 18, 1995, abandoned, which is a continuation-in-part of Ser. No. 368,811, Jan. 6, 1995, abandoned, which is a continuation-in-part of Ser. No. 318,510, Oct. 5, 1994, Pat. No. 5,664,211, which is a continuation-in-part of Ser. No. 220,636, Mar. 31, 1994, Pat. No. 5,664,212, which is a continuation of Ser. No. 74,288, Jun. 8, 1993, Pat. No. 5,305,463, which is a continuation of Ser. No. 702,016, May 17, 1991, abandoned.

[51] Int. Cl.$^6$ ............ H03K 19/0175; H03K 19/003
[52] U.S. Cl. ............................. 326/63; 326/35; 326/9
[58] Field of Search ........................... 326/35–36, 63, 326/93, 9

[56] References Cited

U.S. PATENT DOCUMENTS

| | | | |
|---|---|---|---|
| 4,845,633 | 7/1989 | Furtek | 364/490 |
| 5,534,796 | 7/1996 | Edwards | 326/93 |
| 5,559,453 | 9/1996 | Covino et al. | 326/93 |

FOREIGN PATENT DOCUMENTS

| | | |
|---|---|---|
| 0 566 739 A1 | 10/1993 | European Pat. Off. |
| 0 570 584 A1 | 11/1993 | European Pat. Off. |
| 0 578 821 A1 | 1/1994 | European Pat. Off. |
| WO 92/12498 | 7/1992 | WIPO |
| WO 92/16971 | 10/1992 | WIPO |
| WO 94/03929 | 2/1994 | WIPO |

OTHER PUBLICATIONS

David E. Muller, Asynchronous Logics and Application to Information Processing, Stanford University Press, Switching Theory In Space Technology, pp. 289–297, 1963.

Narinder Pal Singh, A Design Methodology For Self–Timed Systems, Massachusetts Institute of Technology, MIT/LCS/TR–258, Feb. 1981.

T.S. Anatharaman, A Delay Insensitive Regular Expression Recognizer, Dept. of Computer Science, Carnegie–Mellon University, CMU–CS–89–109, Jan. 1989.

Jens Sparso, et al., Design of Delay Insensitive Circuits Using Multi–Ring Structures, European Design Automation Conference, IEEE 0–8186–2780, pp. 15–20, Aug. 1992.

Lawrence G. Heller, et al., Cascode Voltage Switch Logic: A Different CMOS Logic Family, ISSCC 84 Digest of Technical Papers, IEEE, pp. 16–17, Feb. 1984.

M.R. Greenstreet, T.E. Williams, and J. Staunstrup, Self–Timed Iteration, Elsevier Science Publishers B.V. (North–Holland), IFIP, 1988, pp.309–322.

Teresa H.–Y. Meng, Robert W. Brodersen, and David G. Messerschmitt, Automatic Synthesis of Asynchronous Circuits from High–Level Specifications, IEEE Transactions on Computer–Aided Design, vol. 8, No. 11, Nov. 1989, pp. 1185–1205.

Ted Williams, Latency and Throughput Tradeoffs in Self–Timed Speed–Independent Pipelines and Rings, Stanford University Technical Report No. CSL–TR–91–482, May 1991.

(List continued on next page.)

Primary Examiner—Jon Santamauro
Attorney, Agent, or Firm—Steptoe & Johnson LLP

[57] ABSTRACT

An interface circuit between NULL Convention Logic and non-NULL convention memory includes: a first conversion circuit which converts NULL convention address signals to non-NULL address signals. A non-NULL convention memory circuit, e.g., a conventional binary memory, generates non-NULL data signals in response to the non-NULL address signals. A second conversion circuit converts the non-NULL data signals to NULL convention data signals. A timing circuit controls DATA and NULL wavefronts to and through the non-NULL memory.

30 Claims, 13 Drawing Sheets

OTHER PUBLICATIONS

Jens Sparso and Jorgen Staunstrup, Delay–insensitive multi–ring structures, Integration, the VLSI Journal 15, 1993, Elsevier Science Publishers B.V., pp. 313–340.

Tzyh–Yung Wuu and Sarma B.K. Vrudhula, A Design of a Fast and Area Efficient Multi–Input Muller C–element, IEEE Transactions on VLSI Systems, vol. 1, No. 2, Jun. 1993, pp. 215–219.

Marc Renaudin and Bachar El Hassan, The Design of Fast Asynchronous Adder Structures and Their Implementation Using D.C.V.S. Logic, Int'l. Symposium on Circuits & Systems, vol. 4, 1994, pp. 291–294.

Richard G. Burford, Xingcha Fan and Neil W. Bergmann, An 180 Mhz 16 bit Multiplier Using Asynchronous Logic Design Techniques, IEEE 1994 Custom Integrated Circuits Conference, pp. 215–218.

Ted Williams, Self–Timed Rings and Their Application to Division, Stanford University Technical Report No. CSL–TR–91–482, May 1991.

Stephen H. Unger, *Asynchronous Sequential Switching Circuits*, 1969, pp. 221–229.

Carver Mead & Lynn Conway, *Introduction to VLSI Systems*, 1980, pp. 242–262.

Ivan E. Sutherland, *Micropipelines, Communications of the ACM*, Dec. 1989, vol. 32, No. 6.

Wojcik et al., *On the Design of Three Valued Asynchronous Modules, IEEE Transactions on Computers*, Oct. 1980, vol. C–29, No. 10, pp. 889–898.

Tadashi Shibata & Tadahiro Ohmi, *A Functional MOS Transistor Featuring Gate–Level Weighted Sum and Threshold Operations, IEEE Transactions On Electron Devices*, Dec. 1992, vol. 39, No. 6, pp. 1444–1455.

Anthony S. Wojcik & Kwang–Ya Fang, *On The Design Of Three–Valued Asynchronous Modules, IEEE Transactions On Computers*, Oct. 1980, vol. C–29, No. 10, pp. 889–898.

Mark Edward Dean, *Strip: A Self–Timed Risc Processor*, Jun. 1992.

Daniel Hampel & Robert Winder, *Threshold Logic, IEEE Spectrum*, May 1971, pp. 32–39.

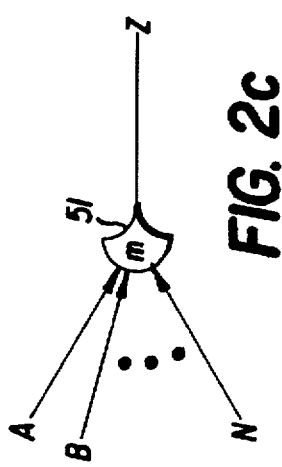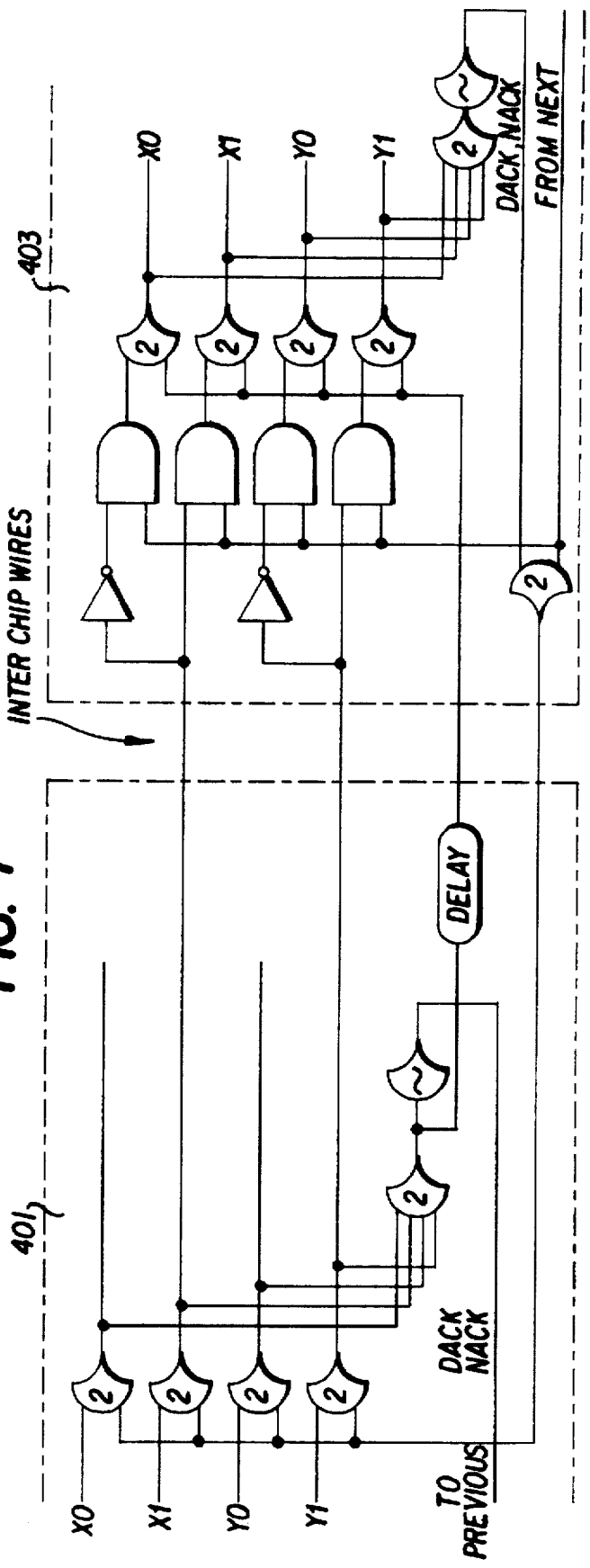

NULL CONVENTION INTERFACE CIRCUITS

This application is a continuation of application Ser. No. 08/423,770, filed Apr. 18, 1995, now abandoned, which is a continuation in part of U.S. patent application Ser. No. 08/368,811 filed Jan. 6, 1995, now abandoned; which is a continuation in part of U.S. patent application Ser. No. 08/318,510 filed Oct. 5, 1994, now U.S. Pat. No. 5,664,211; which was a continuation-in-part of U.S. patent application Ser. No. 08/220,636 filed Mar. 31, 1994 U.S. Pat. No. 5,664,212; which is a continuation of U.S. patent application Ser. No. 08/074,288 filed Jun. 8, 1993, now U.S. Pat. No. 5,305,463; which is a continuation of U.S. patent application Ser. No. 07/702,016, filed May 17, 1991, abandoned, all of which are incorporated here by reference.

BACKGROUND

The emergence of a new, asynchronous, non-boolean logic family presents new problems for system architectures and circuit structures.

SUMMARY

An object of the invention is to provide an interface between NULL convention logic circuits and non-NULL convention circuits.

A further object of the invention is to provide an interface between NULL convention logic circuits and conventional memory circuits.

A further object of the invention is to provide an interface between NULL convention logic circuits and clocked logic circuits.

These and other objects are obtained by providing a first interface circuit which converts NULL convention logic signals to clocked logic signals. A second interface circuit converts clocked logic signals to NULL convention logic signals. Interface circuits are applied to conventional memory, and to reducing pin counts when passing signals between different integrated circuits.

BRIEF DESCRIPTION OF THE DRAWINGS

The invention will be described below with reference to attached drawings in which:

FIG. 2c illustrates a symbol for an n-input threshold-m gate (m-of-n);

FIG. 2d illustrates a symbol for an inverting gate;

FIG. 7 illustrates an architecture for transferring NULL convention logic signals between integrated circuits as binary signals.

DETAILED DESCRIPTION OF THE PREFERRED EMBODIMENTS

The NULL convention circuitry and system architectures described here use NULL convention logic. Theory of operation of NULL convention circuits, details for gate implementations, and operation of an asynchronous register are described in U.S. Pat. No. 5,305,463, co-pending U.S. patent application Ser. No. 08/368,811 and co-pending U.S. patent application Ser. No. 08/318,508 which are incorporated here by reference. For convenience, certain aspects are repeated here.

A NULL convention combinational circuit generates a result value set in response to an input value set. An important aspect of NULL convention circuits is that any particular input may have a meaningful (DATA) value or a NULL value which has no meaning. The very presence of a non-NULL value indicates that the value has meaning, and no external clock is required to indicate that a value is meaningful.

NULL convention differs from traditional boolean logic where each signal line may have one of two meaningful states. In traditional boolean logic that uses a CMOS or TTL implementation, a low voltage level on a signal line means "logic false" or the number "zero." A high voltage level on the same line means "logic true" or the number "one." Thus a signal line may assume one of two values, both of which are meaningful.

NULL convention has multiple implementations, all of which include a NULL state which has no meaning. In one implementation, two separate signal lines would be used to convey two meaningful values. For example, logic "false" would be conveyed by asserting a high voltage on the first line and a low voltage on the second line. Logic "true" would be conveyed by asserting a low voltage on the first line and a high voltage on the second line. NULL would be conveyed by low voltage levels on both lines. (Simultaneous high voltage levels on both lines is an unused combination.) In this example, meaning is expressed according to the signal line asserted, not by the choice of voltage level. A high voltage level "asserts" the meaning of the line. A low voltage level is meaningless.

In another implementation, multiple voltages can be used on a single line to convey multiple meanings and NULL. For example, each signal line may be allowed to assume three voltage levels. A positive voltage level asserts the meaning "true", a negative voltage level asserts the meaning "false", and the zero voltage level is NULL (meaningless). In other implementations, parameters other than voltage may be used, such as current levels, as long as the requisite number of states can be differentiated.

Descriptions here will assume an implementation in which each signal line may assume one of two voltage levels, with a high level asserting meaning (DATA) and the ground voltage level being NULL. This provides voltage levels as concrete examples to aid in explanation, but the invention is not limited to these voltage-level examples.

Figure 1:
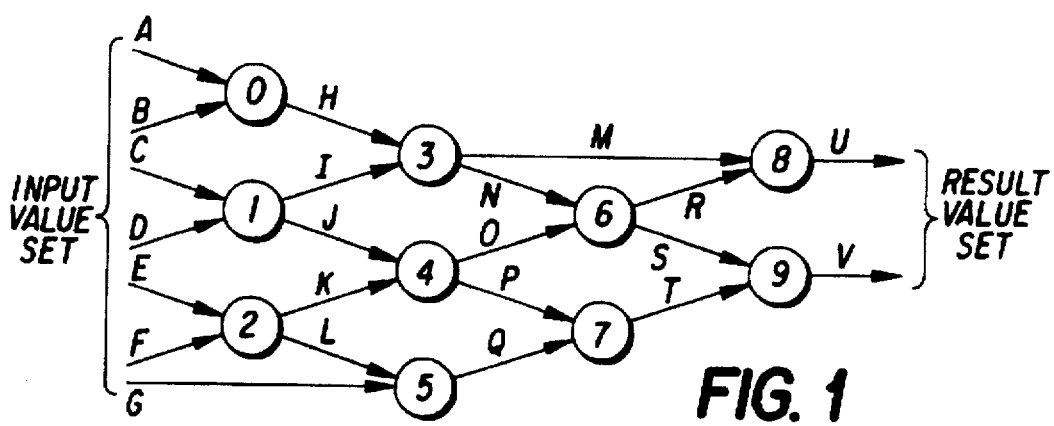
FIG. 1 illustrates a NULL convention combinational circuit.

Another important aspect of NULL convention circuits is the way that meaningful and NULL signals propagate through a combinational circuit. All inputs to a NULL convention logic element must be complete before the element asserts a meaningful output. FIG. 1 illustrates a NULL convention combinational circuit. In FIG. 1, logic gates are shown as circles and labeled with numerals 0–9. Input lines are labeled with letters A–G, output lines are labeled with letters U,V, and internal connection lines are labeled with letters H–T. Signal lines are schematic, and may be individual conductors, multiple conductors, or another NULL convention configuration.

In a NULL convention circuit, a logic gate transitions from a NULL to a meaningful output value after all, or a predetermined set of inputs have assumed meaningful values. For example, as illustrated in FIG. 1, assume that input lines A and B initially have NULL values, and logic gate zero (0) initially has a NULL output. In the case that only input line A transitions to a meaningful value (while input line B remains at NULL), logic gate zero will maintain a NULL output value. In the case that only input line B transitions to a meaningful value (while input line A remains at NULL), logic gate zero still will maintain a NULL output. When both input lines A and B transition to meaningful values (either simultaneously or sequentially), then logic gate zero (0) will change its output to a meaningful value.

The characteristic described above applies to all logic gates in the combinational circuit. Logic gates zero through two, which are directly connected to input lines, will provide a meaningful values to the next level of gates (three through five) only when the respective inputs have completely assumed meaningful values. This produces a general result that can be visualized as a wavefront of meaningful values propagating through the network. At the network output, logic gates eight and nine will change their individual outputs from NULL to meaningful values only when all upstream gates have propagated meaningful values.

Two important characteristics should now be apparent. First, the network outputs transition from NULL to meaningful values cleanly. That is, the outputs do not switch back and forth while partial results have propagated through the intermediate gates. Second, the very presence of a meaningful value at the network output is sufficient to indicate that the network has conclusively resolved all intermediate logic operations. The very presence of a meaningful value is sufficient to indicate that the value is steady, complete, and may be used by downstream circuitry. Thus, no external clock is required to indicate that the network has completed its operations.

The NULL convention logic gates discussed here also exhibit a second characteristic; their outputs transition from a meaningful value to NULL only when all inputs have switched to NULL. In this way, NULL values also propagate through the network cleanly, and the transition to NULL values at the output is sufficient to indicate that all gates in the network have returned to NULL output states.

Figure 2A:
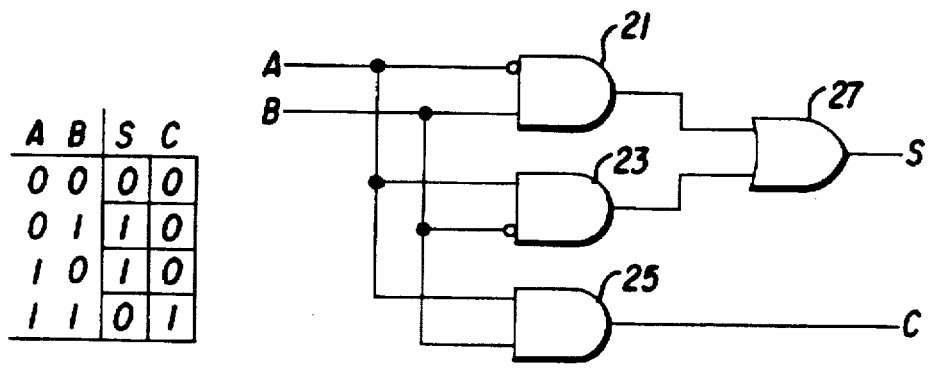
FIG. 2a illustrates a conventional Boolean half-adder.

FIG. 2a illustrates a conventional Boolean half-adder constructed of three AND gates 21, 23, 25 and an OR gate 27. The half adder has two input signal lines A and B, and two output line S (sum) and C (carry). Each input line may assume one of two meaningful values: "zero" and "one." Each output line may assume one of two meaningful values: "zero" and "one." The half adder implements a transfer function such that:

i) when both inputs are zero, sum (S) and carry (C) outputs are "zero;"

ii) when a single input is "one" (and the other is "zero"), sum is "one" and carry is "zero;"

iii) when both inputs are "one," sum is "zero" and carry is "one."

Figure 2B:
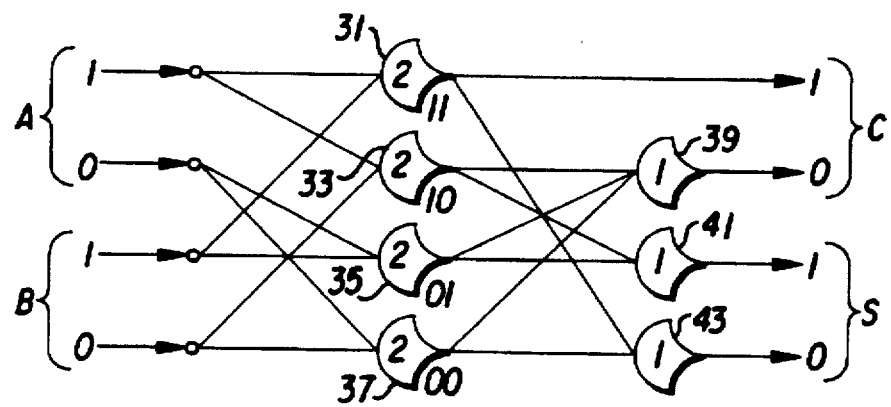
FIG. 2b illustrates a "two-wire" NULL convention half-adder.

For comparison, FIG. 2b illustrates a "two-wire" NULL convention half adder. It is similar to the boolean half-adder of FIG. 2a in that there are two inputs A and B and two outputs S and C, and it implements the same transfer function. Unlike the Boolean circuit, the NULL convention half-adder has a separate signal line for each meaning. The carry output, for example, has two separate signal lines, each of which may assume one of two voltage levels. A first voltage level is meaningful and the other voltage level is NULL. In order to assert a meaning of "carry equals zero," the first signal line 32 (designated as having a meaning "zero" when asserted) is driven to its meaningful voltage level, while the second signal line is held at the NULL voltage level. In order to assert a value "carry equals one," the first signal line is held at the NULL voltage level, while the second signal line 34 (designated by design as having a meaning "one") is driven to the meaningful voltage level. The half-adder can also assert "carry has no meaning" by holding both carry signal lines at NULL. It is not permitted to have both carry lines at the meaningful voltage level. Similarly, the remaining inputs and outputs (A, B, S) each have a pair of signal lines. Each pair of lines is a "mutually exclusive assertion group," which means only one line of any group will be asserted at a time.

Hereafter, when a NULL convention circuit switches a signal line to a meaningful value, it will be said that the circuit "asserts DATA" the line, or that the line is "asserted." When a NULL convention circuit switches a signal line to a NULL value, the line will be said to be NULL or to assert NULL.

The two carry lines form a group in which at most one line may be asserted (i.e., assume a meaningful value). Such a group is referred to has a "mutually exclusive assertion group." In other design situations, mutually exclusive assertion groups may have more than two lines. A single line, by itself, can be considered a mutually exclusive assertion group.

Internally, the NULL convention half adder is made of six threshold gates 31, 33, 35, 37, 39, 41, 43. Each threshold gate has a single signal line output which may be asserted (assume a meaningful voltage level) or NULL (assume a NULL voltage level). The signal line may fan out to several destinations. Four of the gates 31, 33, 35, 37 have two input signal lines and a threshold of two ("threshold-two gate"). The output of a threshold-two gate is asserted when two (both) of the input lines are asserted. One of the gates 39 has three input signal lines and threshold of one ("threshold-one gate"). The output of the threshold-one gate is asserted when any one of the three inputs is asserted. Two of the gates 41, 43 have two inputs and a threshold of one. As a drawing convention, a numeral inside a threshold gate symbol indicates the number of asserted input lines needed to cause the gate to assert its output.

Each of the NULL convention gates of the half adder exhibits the characteristic that it switches to a meaningful value only when the requisite number of inputs becomes meaningful, and each threshold gate holds a meaningful output value until all of the inputs become NULL. Thus, threshold gates exhibit a hysteresis: as the number of inputs drops below the threshold, the output remains meaningful. For example, the threshold-two gates 31, 33, 35, 37 will maintain meaningful output levels when the number of meaningful inputs drops from two to one. The threshold-two gates will switch to NULL when all inputs become NULL.

It should be appreciated that a threshold gate forms a central building block of NULL convention logic circuits. The NULL convention threshold gates may be characterized by the number of inputs and the threshold value. NULL convention threshold gates have the unique operational requirement that some or all inputs will form mutually exclusive assertion groups. They further ensure completeness of the input set, in that they switch to a NULL output only when all inputs are NULL.

FIG. 2c illustrates a symbol 51 for an n-input threshold-m gate (m-of-n). The output Z becomes asserted when at least m of the n inputs is asserted. The output Z returns to NULL only when all of the inputs becomes NULL. This symbol will be used in many forms throughout this description, with the threshold value placed inside the symbol. The number of input signal lines will be apparent from context.

FIG. 2d illustrates a symbol 52 for an inverting gate. An inverting gate generates a NULL signal in response to an asserted signal, and asserts DATA signal in response to a NULL signal. When a NULL convention system is implemented as a two-voltage system, with one voltage signifying data and a ground voltage signifying NULL, a conventional boolean inverting gate can be used as a NULL convention inverting gate.

NULL Convention Logic Interface to Conventional Memory

The duty of a memory in the terms of NULL Convention Logic is to function as a combinational element in a wavefront path. It must convert a data wavefront consisting of an address value into a data wavefront consisting of data values from the addressed memory locations, and it must pass a NULL wavefront as a NULL wavefront.

Because conventional memories have timing considerations (while NULL convention logic is asynchronous), the system must deal with the timing considerations locally to the memory. The memory will be encapsulated by a boundary within which to deal with delay issues. From outside the boundary, the circuit will interact as any other delay insensitive NULL Convention Logic circuit. FIGS. 3a–3g illustrate a conventional memory read within a NULL Convention Logic context.

Figure 3A:
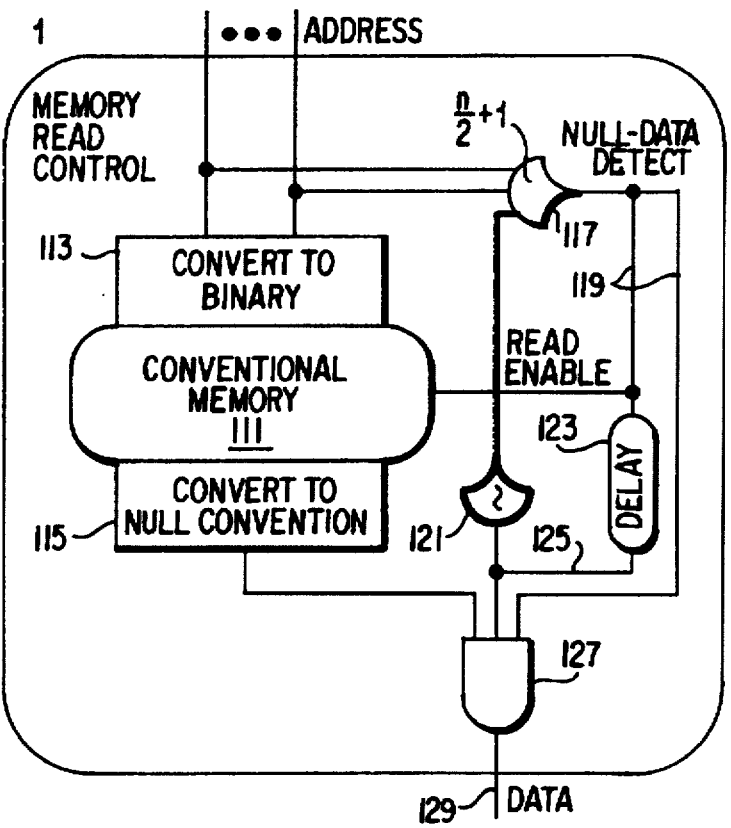
FIGS. 3a–3g illustrate a conventional memory read operation within a NULL Convention Logic context.

FIG. 3a shows a conventional memory 111. A NULL convention interface circuit includes a "convert-to-binary" circuit 113 which converts address signals from NULL Convention Logic signals to binary signals as required by the conventional memory. An illustrative NULL-to-binary circuit is described below with reference to FIGS. 5a and 5b. The interface circuit also includes a "convert-to-NULL" convention interface circuit 115 which converts data signals from binary to NULL convention. An illustrative convert-to-NULL circuit is described below with reference to FIGS. 6a–6f.

A NULL-DATA detect gate 117 monitors the NULL convention address lines and, when asserting DATA, generates a strobe signal on read-enable signal line 119. The NULL-DATA detect gate has a threshold of N/2+1, where N equals the number of NULL convention signal lines, and one (1) is added to account for a feedback signal from inverting gate 121. In this example, each NULL convention address bit is made up of two wires, a first wire meaning data "0" when asserted, the second wire meaning data "1" when asserted. The value N/2 therefore equals the number of bits in the address.

A delay element 123 provides a delayed read-enable signal 125 which is fed back through inverting gate 121 to NULL-DATA detect gate 117. The delayed read-enable signal also feeds forward to three-input gates 127 (referred to here as "output gates"). It should be understood that the symbol for gates 127 represents a bank of gates, one for each data line. Each gate receives one data signal from memory 111, and each receives the read-enable signal 119 and the delayed read-enable signal 125.

The circuit of FIG. 3a is shown in a stable initial state. Narrow lines indicate wires asserting NULL (0 volts). Wide (heavy) lines indicate wires asserting data (5 volts). Null convention address inputs are all NULL. Memory outputs (after conversion to NULL convention) are NULL. NULL-DATA detect gate 117 receives only a single asserted DATA input from inverter 121, and it asserts NULL on read-enable signal line 119. The delayed read-enable signal line 125 is also NULL, which causes inverter to assert DATA to NULL-DATA detect gate 117. All output gates 127 receive NULL, and generate NULL outputs 129. The asserted output from inverter 121 indicates that a NULL wavefront has been passed and that a data wavefront can be accepted.

Figure 3B:
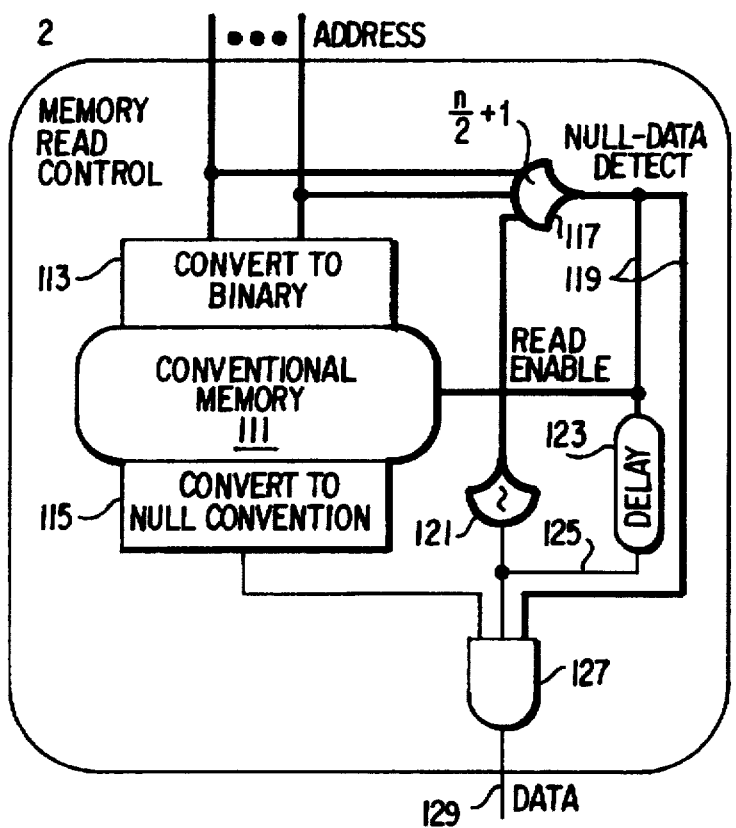

In FIG. 3b, a complete address is received and detected by the NULL-DATA detector 117. The detector is already enabled by an asserted input from inverter 121; therefore, the NULL-DATA detector 117 asserts DATA on read-enable signal line 119. This asserted DATA signal sets the read-enable input for the conventional memory 111. In this figure, the asserted read-enable signal has not yet propagated through the delay element 123. A second delay element (not shown) may be added to read-enable line 119 between the NULL detector 117 and the memory 111 if it is needed for address setup in the memory chip being used. The convert-to-binary circuit 113 converts the NULL convention address to a binary address and present the binary address to the memory 111.

Figure 3C:
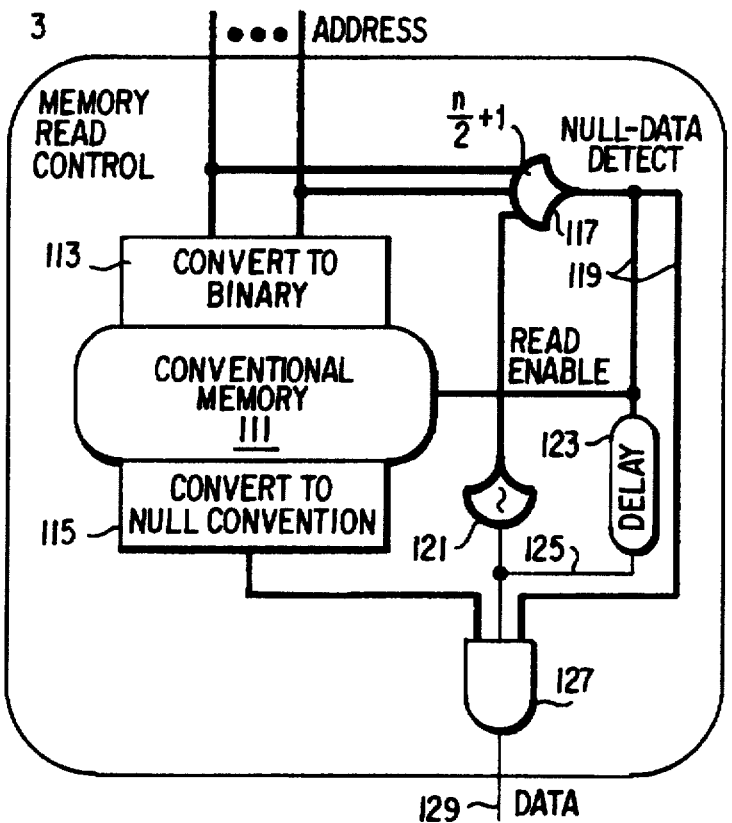

In FIG. 3c, the memory resolves the address and generates binary data. The convert-to-NULL circuit 115 converts the binary data into NULL convention data and presents the NULL convention data to the output gates 127. In this figure, the asserted read-enable signal still has not propagated through the delay element 123.

Figure 3D:
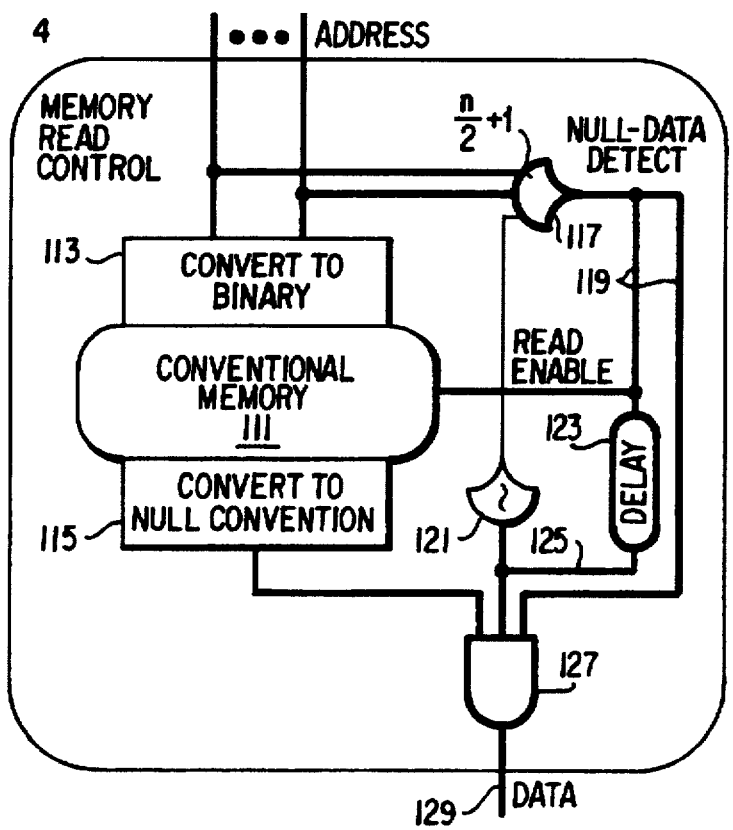

In FIG. 3d, the asserted read-enable signal has propagated through the delay element 123 onto signal line 125. This delay is long enough to ensure that the memory has been read, the data converted and presented to the gates 127, and that the output gates 127 are enabled (by asserted read-enable line 119) to allow the data wavefront to pass on. To circuitry downstream of the gates 127, the appearance of the data wavefront appears as if the address wavefront simply continued through the memory as the data wavefront.

Figure 3E:
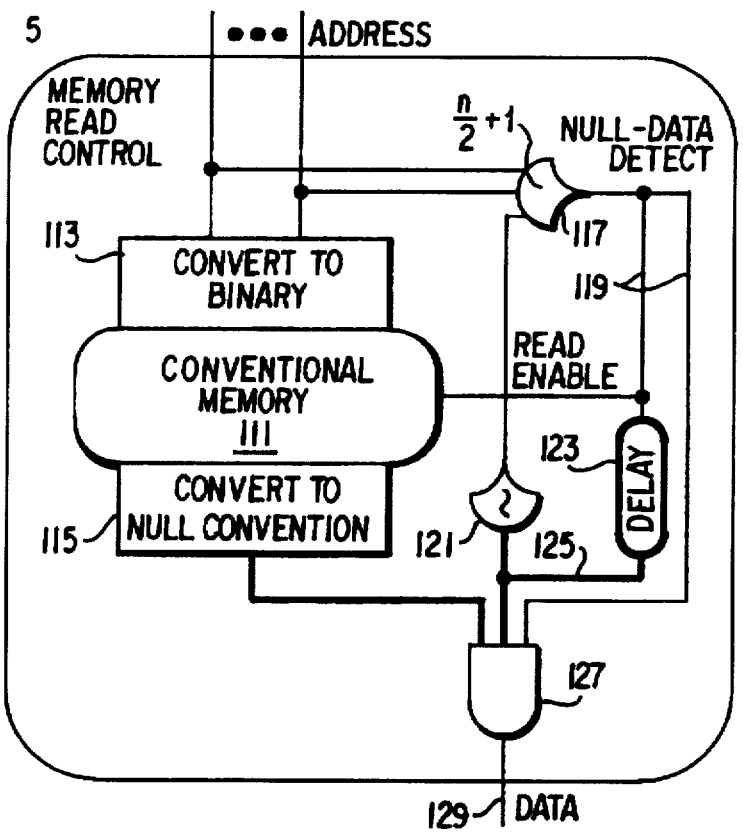

In FIG. 3e, a NULL wavefront arrives on the NULL convention address lines, i.e., the address lines become NULL. The NULL-DATA detector 117 assert a NULL value on read-enable signal line 119. This NULL signal disables the memory read-enable input pin and also disables the output gates. The NULL wavefront must propagate through the memory and settle. To allow this, it is necessary to guarantee that another data wavefront is not received until after the convert-to-NULL circuit 115 converts the memory output to NULL convention form. The inverter 121 accomplishes this by disabling the NULL-DATA detector 117 until the delay period of the delay element 123 has elapsed.

Figure 3F:
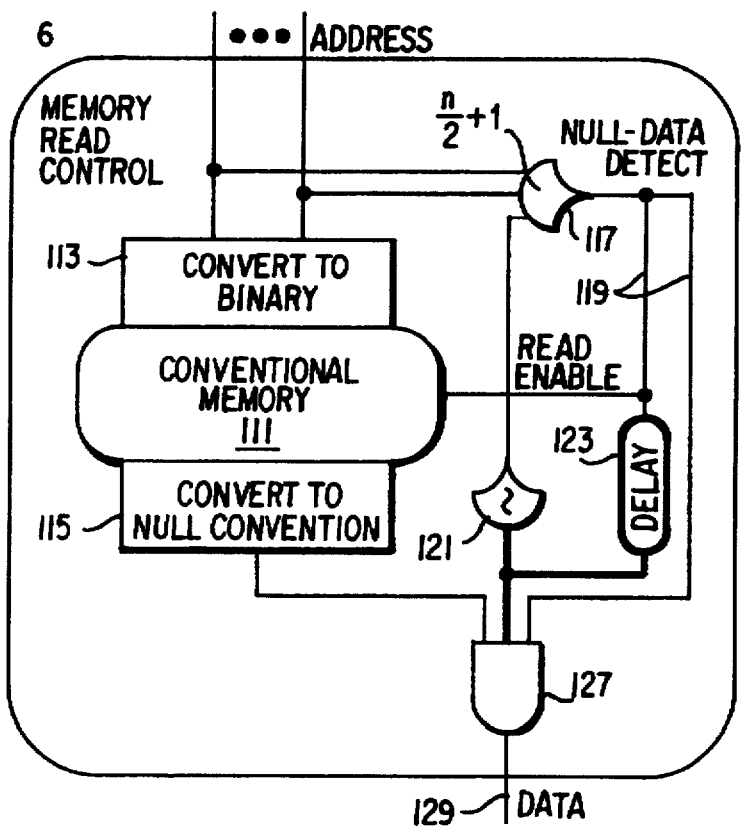

In FIG. 3f, the memory output has settled and been converted to NULL by the convert-to-NULL circuit 115. The NULL signal need not propagate to the gates 127, because the gates themselves generated the NULL wavefront when they were disabled as shown in FIG. 3e. The gates 127 will not be enabled again until valid data is presented by the memory.

Figure 3G:
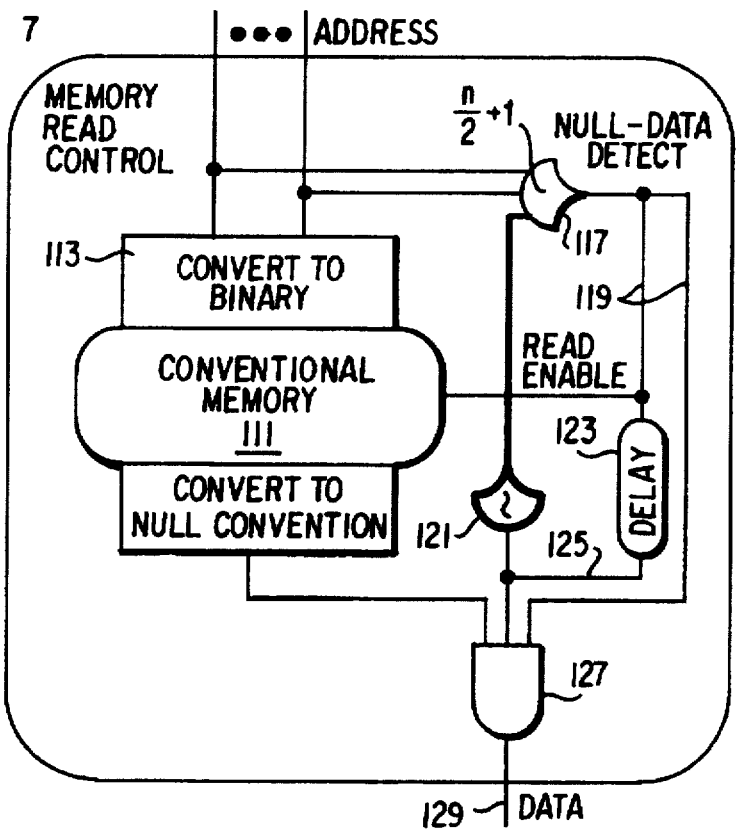

In FIG. 3g, the NULL signal on read-enable signal line 119 has propagated through the delay element 123, and the inverter 121 now asserts DATA to NULL-DATA detector 117. The circuit has returned to the same stable state awaiting the next address wavefront as in FIG. 3a. If an address wavefront arrives early it will be blocked by the NULL-DATA detector 117 until the inverter 121 re-enables it after the delay.

FIGS. 4a–4e illustrate a write sequence for a conventional memory in the NULL Convention context. In the case of a write operation, the data wavefront stops at the memory 111 and is not passed on. What must be passed on is a signal acknowledging that the data wavefront has been received and stored.

FIG. 4a again shows a conventional memory 111 with first and second convert-to-binary circuits 131, 133. The first convert-to-binary circuit 131 receives data signals in NULL convention form and converts them to a binary format suitable for the memory 111. The second convert-to-binary circuit 133 receives address signals in NULL convention form and converts them to binary format suitable for the memory 111.

The interface circuitry also includes two NULL-DATA detectors 135,137, the first 135 for the NULL convention data lines, and the second 137 for the NULL convention address lines. Both NULL-DATA detectors have thresholds of n/2 where n equals the number of signal lines (and n/2 equals the number of binary bits in the address or data bus). A threshold-three gate 139 receives inputs from the two NULL-DATA detectors 135, 137 and generates a write enable signal on signal line 141. A delay element 143 receives the write enable signal and generates a delayed write enable signal on signal line 145. An inverter 149 generates an enable signal for the threshold-three gate 139 based on the delayed write enable signal. A DACK/NACK gate 147 generates a NULL convention DACK/NACK signal indicating that data has been received and stored.

Figure 4A:
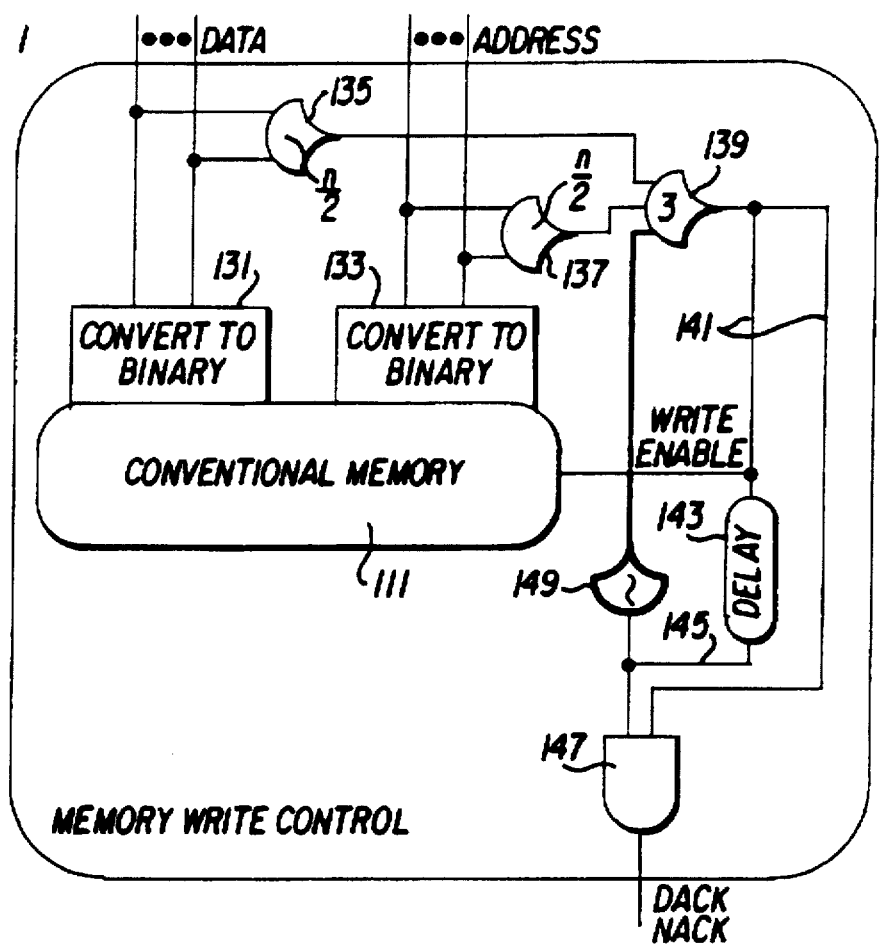
FIGS. 4a–4e illustrate a conventional memory write operation within a NULL Convention Logic context.

In FIG. 4a, the circuit is in steady state. The data and address lines are all NULL. Outputs of NULL-DATA detectors 135, 137 are NULL. Write enable signal line 141 is NULL. The output of delay element 143 is NULL. Inverter 149 asserts DATA, and DACK/NACK gate 147 asserts NULL. The asserted DATA signal from the inverter 149 indicates that a NULL wavefront has been passed and that a data wavefront can be accepted.

Figure 4B:
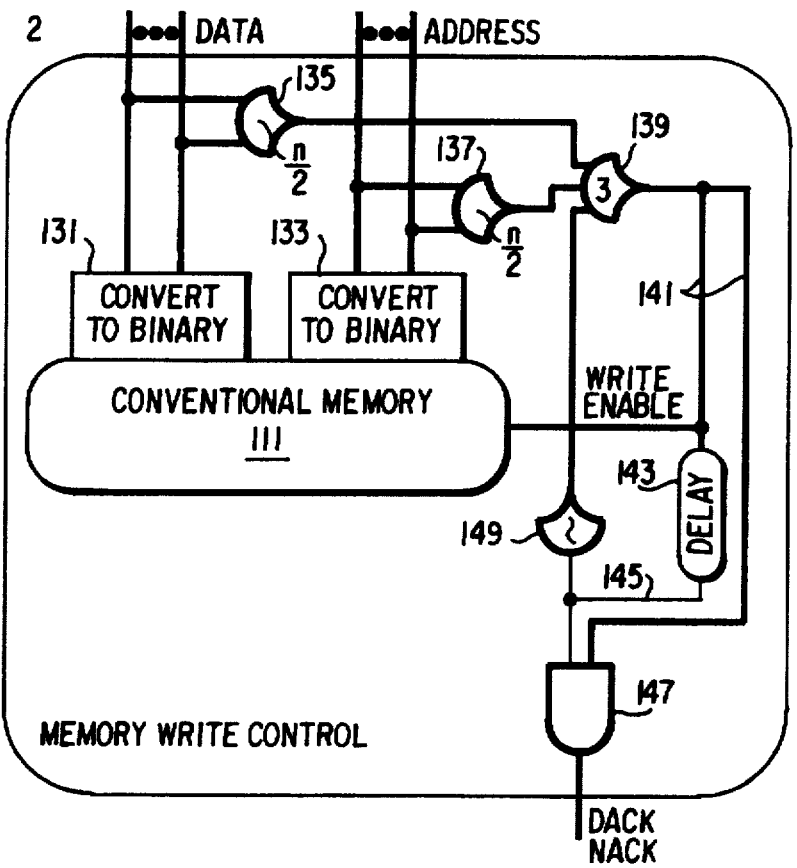

In FIG. 4b complete address and data wavefronts are received and detected by the NULL-DATA detectors 135, 137. The threshold-three gate 139 is already enabled by asserted DATA signal from inverter 149; therefore, the threshold-three gate 139 asserts DATA on write enable signal line 141. This sets the write enable for the memory. There may be a second delay element added to this line between the threshold-three gate 139 and memory 111 if it is needed for address setup. The convert-to-binary circuits 131, 133 convert NULL convention address and the data to binary and present them to the memory 111.

For this interface circuit, there are two NULL-DATA detectors: one for the address lines and one for the data lines. Data wavefronts for address and data lines must both have arrived before the write operation can begin. The threshold-three gate synchronizes address and data wavefronts into a single write enable strobe.

Figure 4C:
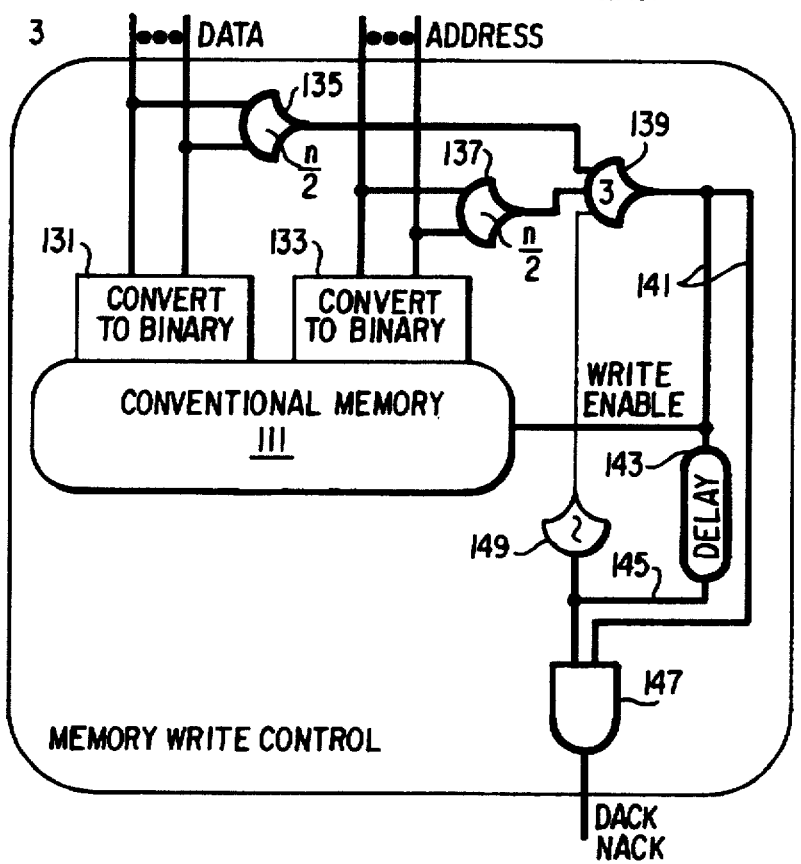

In FIG. 4c, the asserted DATA signal on write signal line 141 has propagated through the delay element, and the output of the inverter 149 has switched to NULL. The output gate 147 now asserts DATA, which indicates that the data has been received. Downstream circuitry (not shown) which may be awaiting the acknowledge signal will detect it and request a NULL wavefront from upstream circuitry (not shown).

Figure 4D:
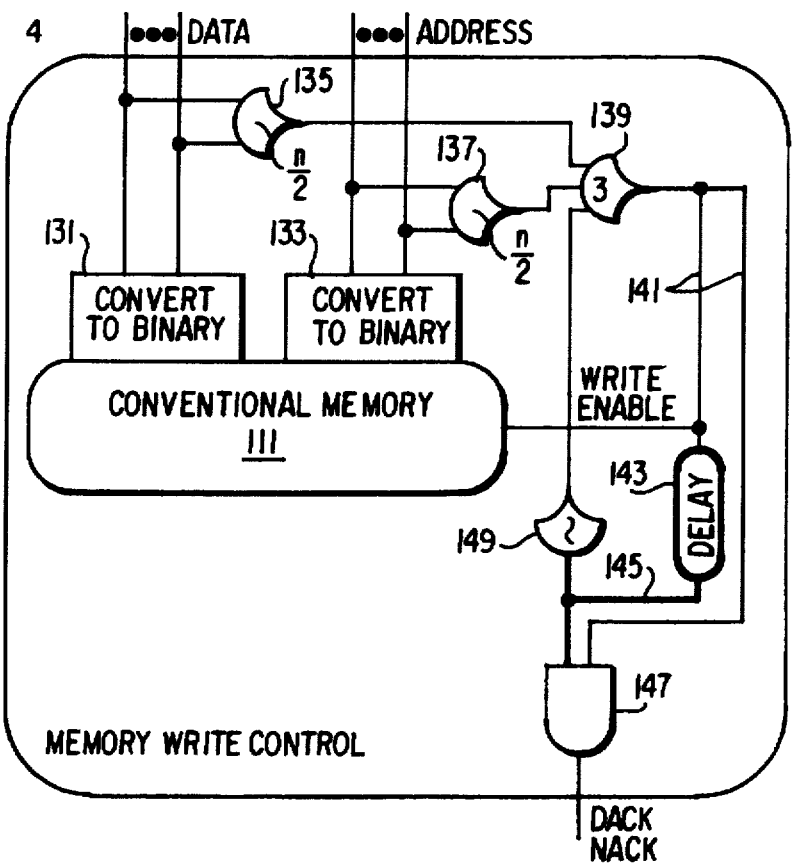

In FIG. 4d, NULL wavefronts arrive on the data and address lines, and these NULL wavefronts are detected by the NULL-DATA detectors 135, 137. Threshold-three gate 139 now receives all NULL inputs and switches write enable line 141 to NULL. This turns off the write enable pin of memory 111 and also causes gate 147 to assert NULL, indicating that the NULL wavefront has been received. In this figure, the NULL signal on write enable line 141 has not propagated through delay element 143. The inverter 149 asserts NULL, which inhibits an early-arriving data or address wavefront.

Figure 4E:
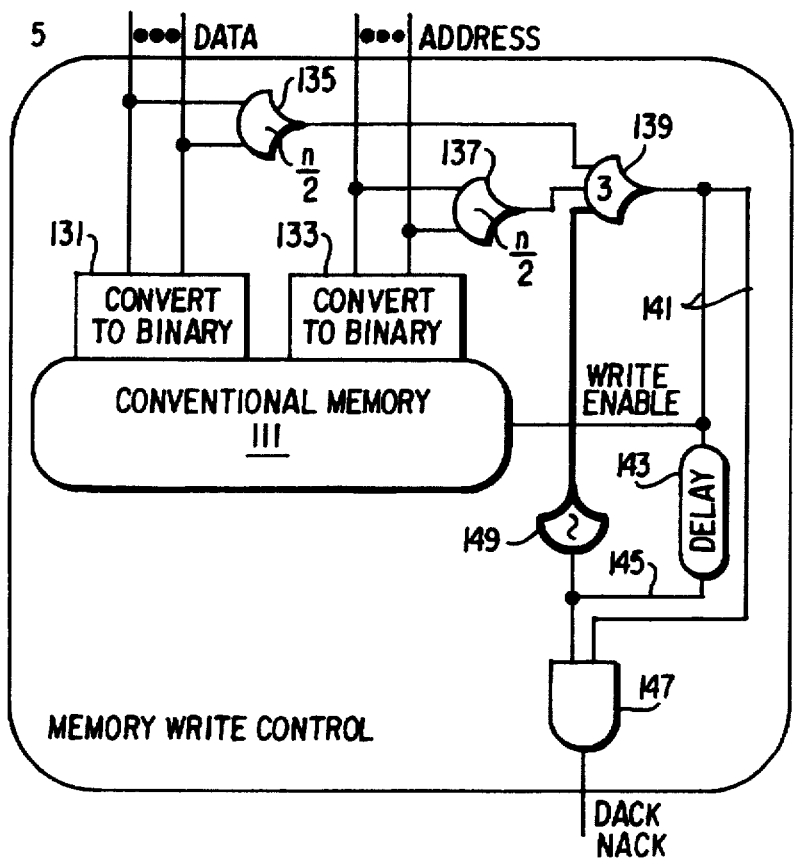

In FIG. 4e, the NULL signal on write enable signal line 141 has propagated through the delay element 143. The inverter 149 asserts DATA to the threshold-three gate 139, and the circuit has returned to the same stable state as in FIG. 4a.

NULL Convention Logic Interface to Clocked Boolean Circuits

NULL Convention Logic circuits can be interfaced to standard clocked Boolean logic circuits with a handshake protocol. From NULL Convention Logic to Boolean logic, the wire that carries the same meaning with the same voltage level in both systems is extended.

For instance, assume DATA is expressed with a 5V level in the NULL convention logic circuit and TRUE is expressed with a 5V level in the Boolean circuit. When TRUE is expressed in NULL convention logic, the wire meaning TRUE will be at 5V. When FALSE is being expressed in NULL convention logic the wire meaning TRUE will be at 0V. The NULL convention logic wire that means TRUE can just be extended to the Boolean circuit as shown below.

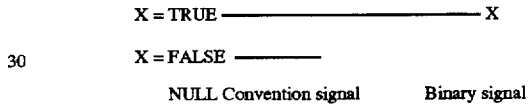

Figure 5A:
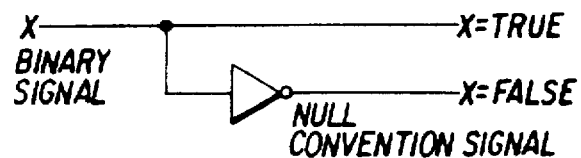
FIGS. 5a–5b illustrate circuits for converting signals from NULL convention circuits to Boolean logic circuits.

To convert from Boolean to NULL convention logic one can invert the Boolean signal as shown in FIG. 5a.

Figure 5B:
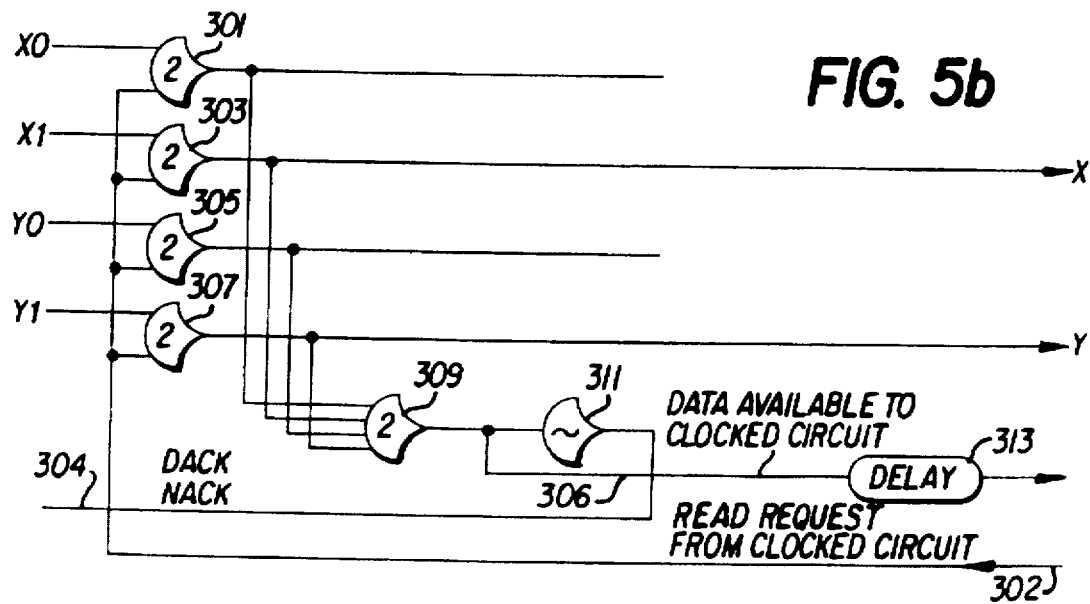

To transfer from NULL convention logic to clocked Boolean, the clocked circuit must be able to request data and then wait for it. FIG. 5b shows a NULL-to-clocked Boolean interface circuit. A first mutually exclusive assertion group made of up two wires X0 (meaning "X=0") and X1 (meaning "X=1") will be converted into a single binary signal x. A second mutually exclusive assertion group made up of two wires Y0 (meaning "Y=0") and Y1 (meaning "Y=1") will be converted into a single binary signal y. Four threshold two gates 301, 303, 305, 307, along with a watcher gate 309 and inverter gate 311 are configured as an asynchronous register. Further description of NULL convention asynchronous registers can be found in co-pending U.S. patent application Ser. No. 08/318,508 filed Oct. 5, 1994, which is incorporated here by reference.

In an initial state, gates 301, 303, 305, 307 receive all NULL inputs and generate NULL outputs on signal lines x, y. Watcher 309 receives all NULL inputs and generates a NULL signal (0V) which, after passing through delay 313, serves as a signal to the clocked Boolean logic that data is not available. Inverter 311 asserts DATA on DACK/NACK signal line 304, which signals upstream NULL convention circuitry (not shown) that the interface circuit is ready to accept data.

When downstream boolean circuitry (not shown) supplies a clocked data request on signal line 302, which acts as one asserted input to gates 301, 303, 305, 307. When upstream NULL convention logic presents a data wavefront to gates 301, 303, 305, 307, the wavefront passes through the gates and appears as data on signal lines x, y. Watcher 309 detects the presence of data, and asserts DATA on line 306 which, after passing through delay element 313, signals downstream clocked Boolean circuitry (not shown) that data is available. Inverting gate 311 asserts NULL on DACK/NACK signal line 304, which signals upstream NULL convention circuitry (not shown) to present a NULL wavefront.

In response to the request for NULL, upstream NULL convention circuitry (not shown) presents NULL to gates 301, 303, 305, 307. When the NULL wavefront arrives, it passes through gates 301, 303, 305, 307. Watcher 309 now receives all NULL inputs and asserts NULL on its outputs. The output from the delay element 313 goes low, indicating that data is not available. The circuit has now completed one cycle and is ready to transfer more data.

Figure 6A:
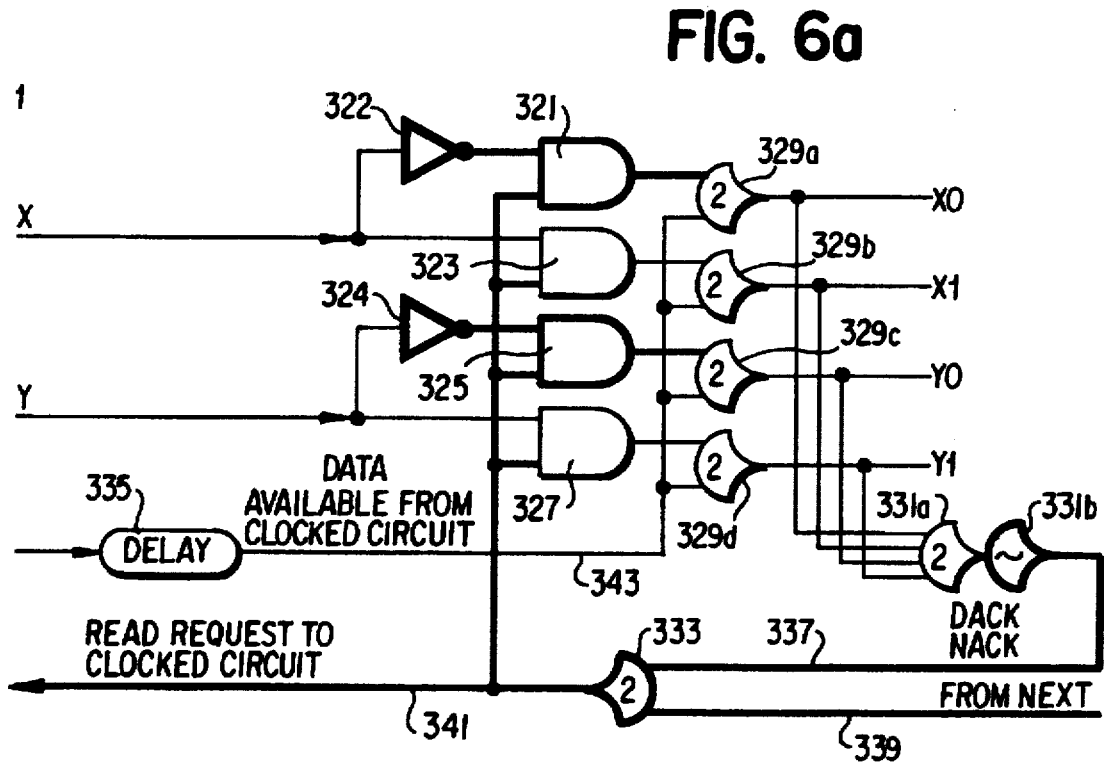
FIGS. 6a–6f illustrate a circuit for converting signals from Boolean logic circuits to NULL convention logic circuits.

Interfacing from clocked Boolean logic to NULL convention logic is more involved, because the NULL wavefront has to be generated and managed. FIG. 6a illustrates a circuit for interfacing two Boolean signal lines x, y to four NULL convention signal lines X0, X1, Y0, Y1 (meaning "X=0," "X=1," "Y=0," and "Y=1" respectively). The circuit includes four Boolean AND gates 321, 323, 325, 327, two Boolean inverters 322, 324, an asynchronous register (329a–329d and 331a, 331b), a threshold-two gate 333 and a delay element 335. One inverter 322 and two Boolean AND gates 321, 323 are configured to generate two signal lines from the first input signal line x. The other inverter 324 and the other two Boolean AND gates 325, 327 are configured to generate two signal lines from the second input signal line Y. Threshold-two gates 329a–329d each receive one signal line from a corresponding Boolean AND gate 321, 323, 325, 327 and a second "data available" signal line from the upstream Boolean circuit (not shown). A watcher 331a detects the presence of data in the threshold-two gates 329a–329, and its associated inverting gate 331b generates a DACK/NACK signal 337. An enable gate 333 receives the DACK/NACK signal 337, as well as a "from next" signal from downstream NULL convention circuitry (not shown), and generates an enable signal 341.

The circuit of FIG. 6a is shown in a stable initial state. Narrow lines indicate wires asserting NULL (0 volts). Wide (heavy) lines indicate wires asserting data (5 volts). Input signal lines x,y are both at logic 0 (0V). Output signal lines X0, X1, Y0, Y1 are at NULL. Watcher 331a receives all NULL inputs, and its associated inverting gate 331b asserts DATA. Downstream NULL convention (not shown) is ready to accept data and asserts DATA on "from next" signal line 339. The output of enable gate 333 is asserted DATA, which corresponds to logic HIGH. Outputs of inverters 322, 324 are both logic HIGH, and two Boolean AND gates 321, 325 are output high, which corresponds to asserting DATA. The outputs of Boolean AND gates constitute data presented to the register gates 329a–329d, but the "data available" line 343 from upstream Boolean circuitry is NULL and the data has no effect.

Figure 6B:
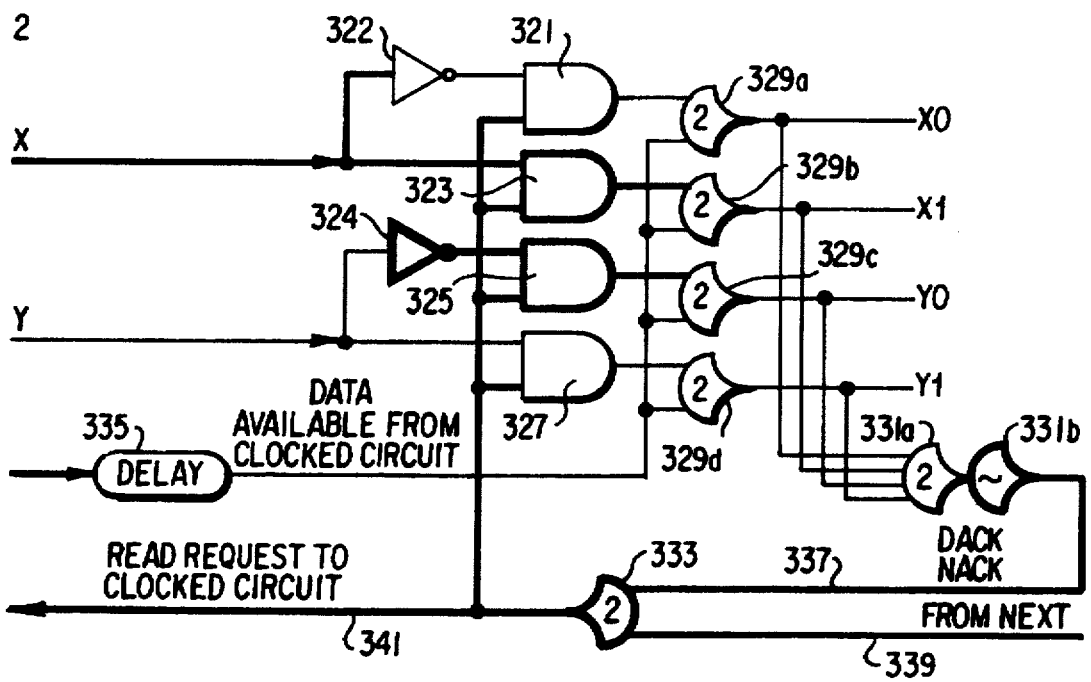

In FIG. 6b, data arrives in the form of: 1) signal line x switching to logic HIGH, and 2) input to delay element 335 switching to logic HIGH. Boolean inverter 321 switches its output to logic LOW, and Boolean AND gates 321, 323 change state (gate 321 switches its output to LOW, and gate 323 switches its output to HIGH). The data presented to the NULL convention register gates 329a–329d has no effect, because enable line 343 remains LOW (NULL).

Figure 6C:
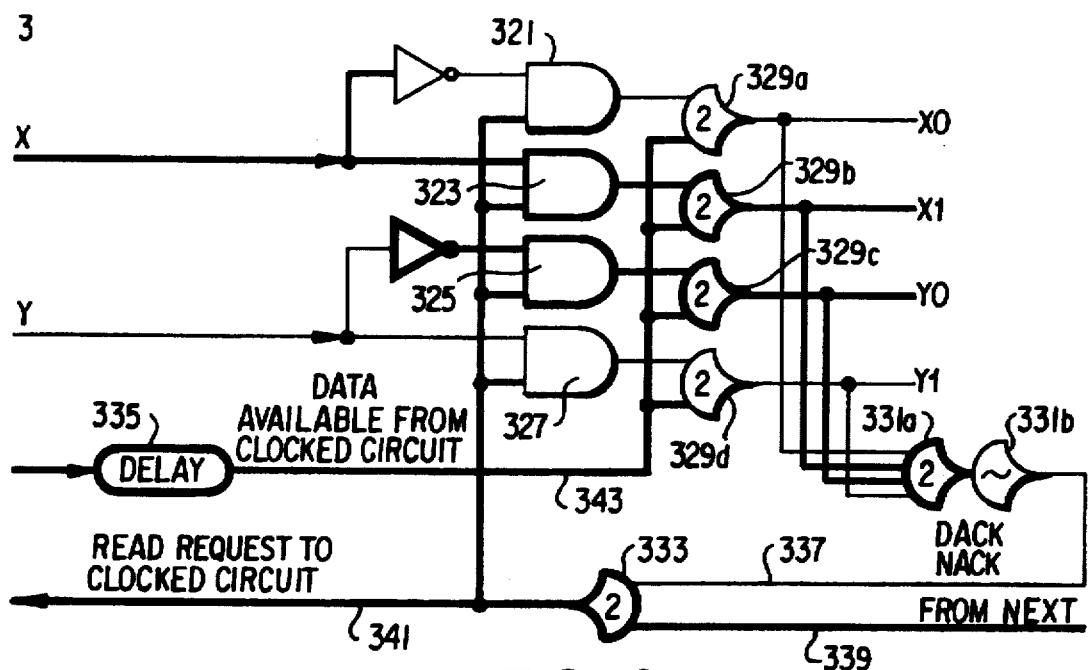

In FIG. 6c, the data available signal propagates through the delay element onto enable line 343 and arrives at the NULL convention register gates 329a–329d. The data outputs from Boolean AND gates 321, 323, 325, 327 plays through the register gates 329a–329d and onto NULL convention signal lines X0, X1, Y0, Y1. The watcher 331a detects the data wavefront, and its associated inverting gate 331 asserts NULL on DACK/NACK line 337. This NULL signal is blocked at the enable gate 333.

The Boolean clocked circuit must hold the data stable until its reception is acknowledge by downstream NULL convention logic, which will do so by asserting NULL on "from next" signal line 339. This insures that the data presented to the register gates 329a–329d will not change until a NULL wavefront is presented.

Figure 6D:
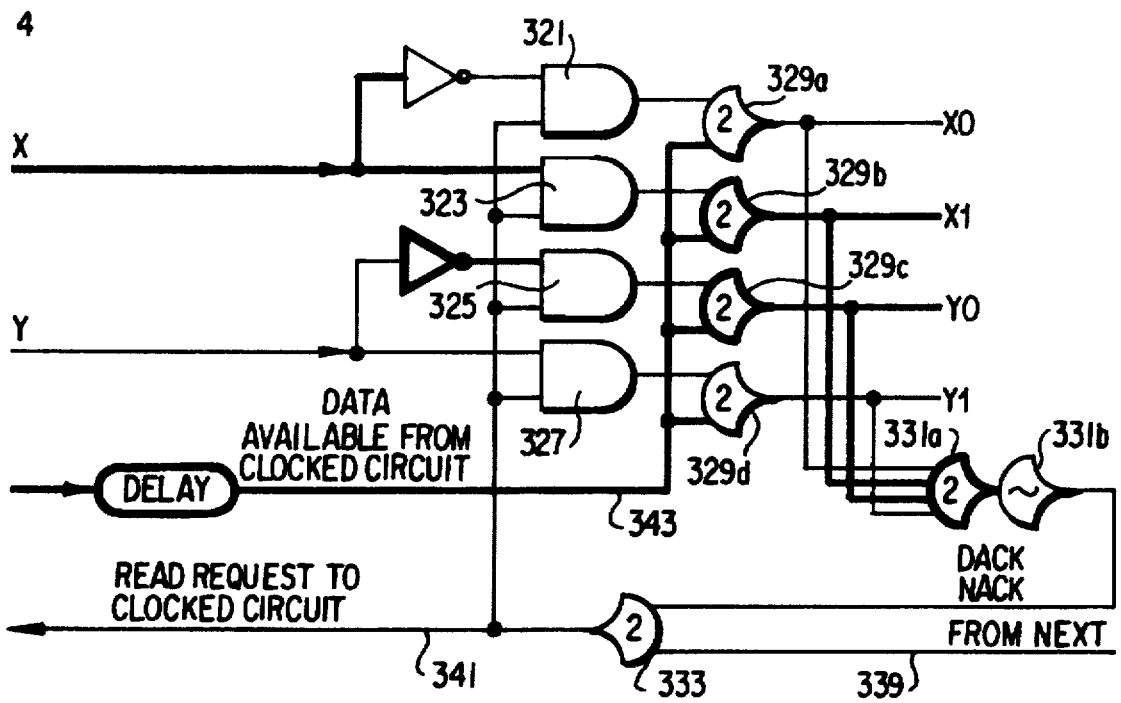

In FIG. 6d, the downstream NULL convention circuit requests NULL by switching the "from next" signal line 339 to NULL. The enable gate 333 now receives all NULL inputs and asserts NULL on signal 341. The NULL signal on line 341 disables the Boolean AND gates 321, 323, 325, 327, which in turn present a NULL wavefront to the register gates 329a–329d. (The register gates 329a–329d will not store the NULL wavefront until the data available signal line 343 becomes NULL.) The NULL (LOW) signal on line 341 also acknowledges the receipt of the data to the clocked Boolean circuit. By disabling the AND gates 321, 323, 325, 327 prior to allowing the clocked Boolean circuit to switch the input data, spurious data will not be presented to the register gates 3219–329d while they are enabled to store data. The clocked Boolean circuit can now set the data available signal 343 to NULL by switching the input to delay element 335 to logic LOW.

Figure 6E:
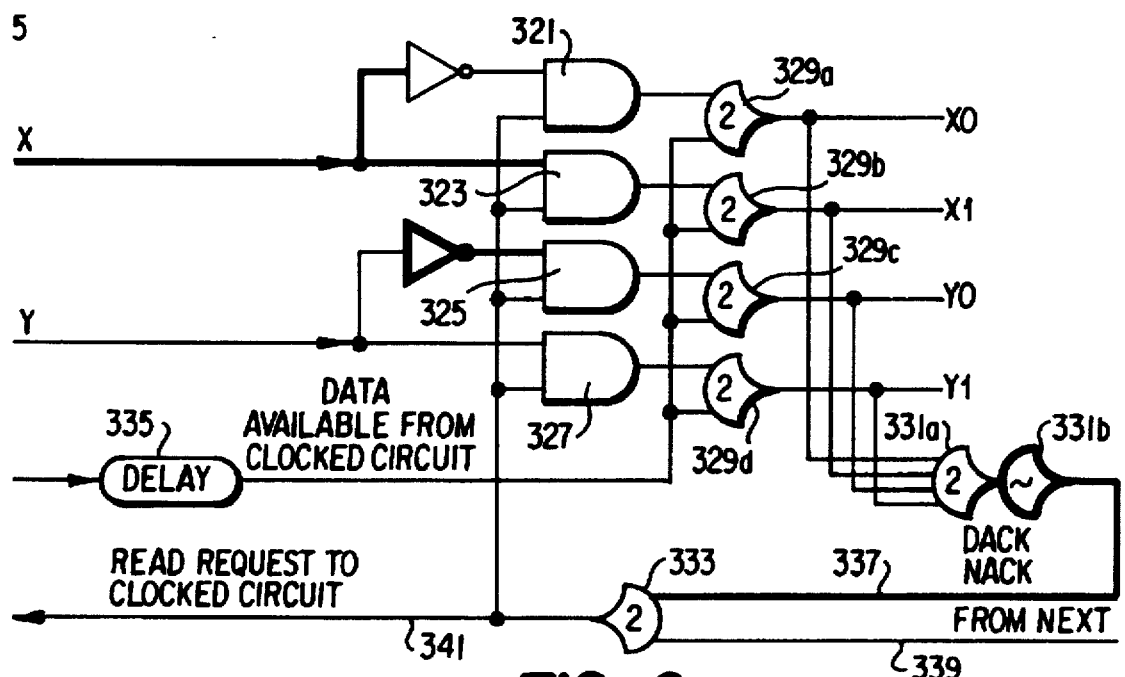

In FIG. 6e, the clocked Boolean circuit has set the data available signal line 343 to NULL (logic LOW having propagated through the delay element 335). The register gates 329a–329 now pass the NULL wavefront to NULL convention signal lines X0, X1, Y0, Y1. Watcher 331a detects the NULL wavefront, and its associated inverter gate 331b asserts DATA on DACK/NACK signal line 337. The input data values to the Boolean AND gates 321 323, 325, 327 (from the clocked Boolean circuit) are floating at this stage, but any spurious signals are blocked by the disabled AND gates 321, 323, 325, 327.

Figure 6F:
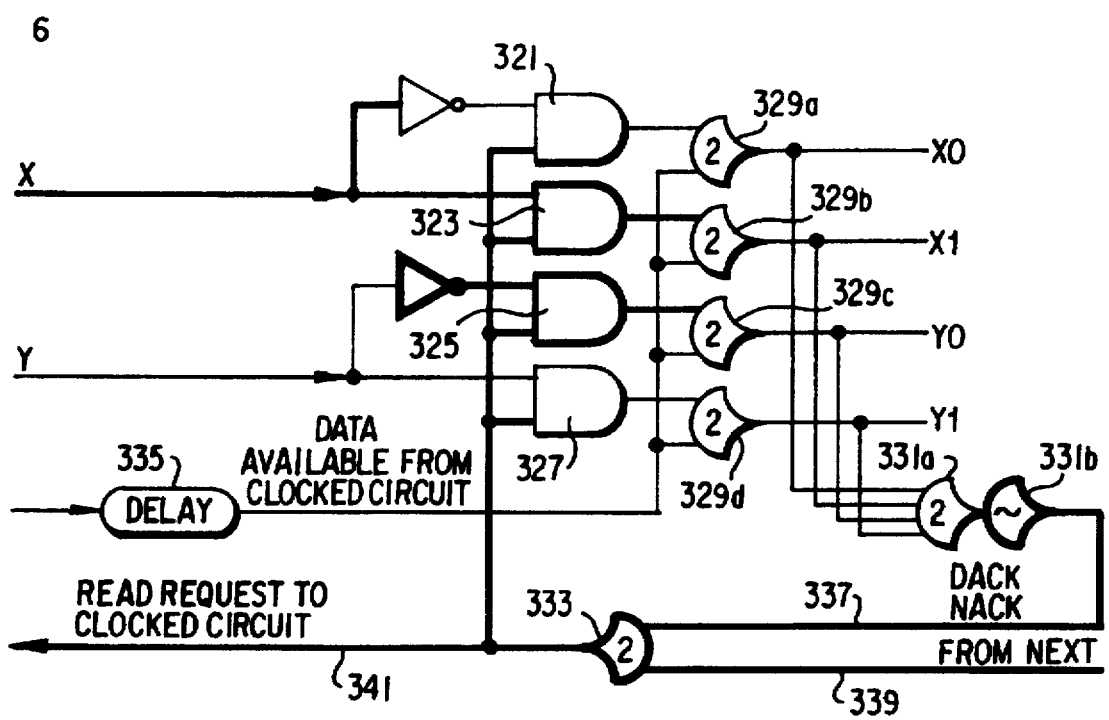

In FIG. 6f, the NULL wavefront has been detected by downstream NULL convention circuit, which requests a new data wavefront by asserting DATA on "from next" signal line 339. Enable gate 333 asserts DATA (HIGH) on signal line 341. This allows the data request to be passed on to the clocked circuit and also enables the AND gates 321, 323, 325, 327 to pass the floating data values. Any spurious signals have no effect, because the register gates 329a–329d are disabled and will not be enabled until a legitimate data wavefront has stabilized on their inputs. The circuit has returned to the stable state of Fig. 6a and is again awaiting data.

Pin Conserving Inter-Chip Interface

Even though the embodiment of NULL convention described here uses two signal lines to represent one binary bit of data, data can be moved between different integrated circuit chips using the same number of pins as clocked Boolean circuits. The NULL convention logic signals are converted to Boolean signals before leaving the chip of origination. They move between the chips as binary logic signals, and are reconverted to NULL convention logic signals at the destination chip. Such an inter-chip circuit is shown in FIG. 7. Item 401 indicates a circuit for converting NULL convention signals to Boolean signals. The circuit 401 is substantially the same as shown in FIG. 5b and discussed above. Item 403 indicates a circuit for converting Boolean signals to NULL convention signals. The circuit 403 is substantially the same as shown in FIGS. 6a–6f and discussed above.

After learning of the embodiments described above, people practicing in this art will be able to make variations that fall within the spirit and scope of the invention. The embodiments described above are exemplary but not intended to limit unduly the scope of the invention as defined by the following claims.

What is claimed is:

1. An interface circuit between NULL Convention Logic and non-NULL convention memory comprising:

a first conversion circuit converting NULL convention address signals to non-NULL address signals;

a non-NULL convention memory circuit generating non-NULL data signals in response to the non-NULL address signals;

a second conversion circuit converting the non-NULL data signals to NULL convention data signals.

2. A two-state-logic to NULL convention logic interface comprising:

an input signal line receiving an input signal from a signal source, said input signal having first and second logic states;

a first output signal line having a meaningful state and a NULL state;

a second output signal line having a meaningful state and a NULL state;

a first gate driving the first output signal line to the meaningful state when the input signal line is in the first logic state; and a second logic gate driving the second output signal line to the meaningful state when the input signal line is in the second logic state;

wherein both the first and second output signal lines simultaneously assume the NULL state before either output signal line is driven to a meaningful state.

3. The interface of claim 2 wherein the input signal line receives a Boolean logic signal.

4. The interface of claim 2 further comprising means for simultaneously triggering both the first and the second NULL convention logic gate outputs into the NULL state in response to a state transition of the input signal line.

5. The interface of claim 2 wherein the triggering means includes a NULL convention watcher gate providing a feedback signal when one of the first and second output signal lines is in a meaningful state, said feedback signal simultaneously triggering both the first and second NULL convention logic gate outputs into a NULL state.

6. The interface of claim 2 further comprising:

a first buffer having an output connected to an input of the first NULL convention gate;

a second buffer having an output connected to an input of the second NULL convention gate; and a NULL convention watcher gate providing a negative feedback signal to inputs of the first and second buffers when one of the first and second output signal lines is in a meaningful state.

7. The interface of claim 2 further comprising means for providing a timing signal to the signal source when the interface is in a state ready to receive a new logic signal.

8. The interface of claim 2 further comprising a delay element on the input signal line.

9. A NULL convention logic to two-value-logic interface comprising:

a first input signal line receiving a first input signal from a signal source, said first input signal having a meaningful state and a NULL state;

a second input signal line receiving a second input signal from a signal source, said second input signal having a meaningful state and a NULL state; and a logic network driving an output signal line to a first logic state when the first signal line is in the meaningful state and driving said output signal line to a second logic state when the second signal line is in the meaningful state;

wherein at most one of said first and second signal lines assumes a meaningful state at a time, and at a prior time both the first and second signal lines simultaneously assume the NULL state.

10. The interface of claim 9 wherein the network comprises:

a first gate receiving the first signal line;

a second gate receiving the second signal line, wherein one of the first and second logic gates drives the output signal line; and a watcher gate providing a feedback signal to a signal source when an output of one of the first and second gates is in a meaningful state.

11. The interface of claim 9 wherein the network comprises:

a first gate receiving the first signal line;

a second gate receiving the second signal line, wherein one of the first and second logic gates drives the output signal line; and a watcher gate providing a data available signal on a data available signal line to a receiving circuit when an output of one of the first and second gates is in a meaningful state.

12. The interface of claim 11 further comprising a delay element on the data available signal line.

13. The interface of claim 11 wherein the first and second gates are NULL convention gates.

14. The interface of claim 9 further comprising a read request signal line receiving a read request signal line from a receiving circuit, said read request signal at least in part triggering the network to drive the output signal line to a logic state.

15. A NULL convention logic to memory interface for reading comprising:

NULL convention address signal lines, each address signal line having a meaningful logic state and a NULL state;

a first NULL convention to binary conversion circuit receiving the NULL convention address signal lines and generating binary address signals;

a binary memory circuit receiving the binary address signals and generating binary data signals;

a binary to NULL convention conversion circuit receiving binary data signals and generating NULL convention data signals.

16. The circuit of claim 15 further comprising:

a read enable gate monitoring the NULL convention address signal lines and generating a read enable signal to the binary memory circuit when ones of the NULL convention address signal lines are in the meaningful state.

17. The interface of claim 16 further comprising a feedback signal path from the output of the read enable gate to the input of the read enable gate.

18. The interface of claim 16 further comprising:

a feedback signal path from the output of the read enable gate to the input of the read enable gate; and a delay element in the feedback signal path.

19. The interface of claim 16 further comprising output gates, each receiving a NULL convention data signal line and an output from the read enable gate.

20. A NULL convention logic to memory interface for writing comprising:

NULL convention address signal lines, each address signal line having a meaningful state and a NULL state;

a first NULL convention to binary conversion circuit receiving the NULL convention address signal lines and generating binary address signals;

NULL convention data signal lines, each data signal line having a meaningful logic state and a NULL state;

a second NULL convention to binary conversion circuit receiving the NULL convention data signal lines and generating binary data signals; and a binary memory receiving the binary address and data signals.

21. The interface of claim 20 further comprising:

a write enable gate monitoring the NULL convention address signal lines and the NULL convention data signal lines, said write enable gate generating a write enable signal to the binary memory when ones of the NULL convention address and data signal lines are in the meaningful state.

22. The interface of claim 21 further comprising:

a gate monitoring the NULL convention address signals and generating a signal to the write enable gate when ones of the NULL convention address signal lines are in the meaningful state.

23. The interface of claim 21 further comprising:

a gate monitoring the NULL convention data signals and generating a signal to the write enable gate when ones of the NULL convention data signal lines are in the meaningful state.

24. The interface of claim 21 further comprising a feedback path from an output of the write enable gate to an input of the write enable gate.

25. The interface of claim 21 further comprising:

a feedback path from an output of the write enable gate to an input of the write enable gate; and a delay element in the feedback path.

26. The interface of claim 20 further comprising:

a NULL convention DACK/NACK signal line driven to a meaningful state after data has been written into the memory circuit.

27. A package-to-package NULL convention interface comprising:

a first NULL convention circuit generating NULL convention output signals;

a first conversion circuit receiving the NULL convention output signals and generating multi-value output signals;

a second conversion circuit receiving the multi-value output signals and generating NULL convention input signals; and a second NULL convention circuit receiving NULL convention input signals.

28. The interface of claim 27 wherein the multi-value signals comprise binary signals.

29. The interface of claim 27 wherein the first NULL convention circuit and the first conversion circuit are contained in a single package.

30. The interface of claim 27 wherein the first NULL convention circuit and the first conversion circuit are fabricated on a common semiconductor chip.

* * * * *